(12) United States Patent
Ito et al.

(10) Patent No.: US 10,477,694 B2
(45) Date of Patent: *Nov. 12, 2019

(54) WIRING BOARD MANUFACTURING METHOD AND WIRING BOARD

(71) Applicant: DEXERIALS CORPORATION, Tokyo (JP)

(72) Inventors: Makiya Ito, Tochigi (JP); Ryosuke Endo, Tochigi (JP); Kazuo Goto, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/735,772

(22) PCT Filed: Jun. 22, 2016

(86) PCT No.: PCT/FR2016/068543
§ 371 (c)(1),
(2) Date: Dec. 12, 2017

(87) PCT Pub. No.: WO2017/018103
PCT Pub. Date: Feb. 2, 2017

(65) Prior Publication Data
US 2019/0159345 A1    May 23, 2019

(30) Foreign Application Priority Data

Jul. 30, 2015  (JP) .................................. 2015-150835
Jun. 22, 2016  (JP) .................................. 2016-123571

(51) Int. Cl.
*B32B 3/00*     (2006.01)
*H05K 3/12*     (2006.01)
(Continued)

(52) U.S. Cl.
CPC ............ *H05K 3/1208* (2013.01); *H05K 1/034* (2013.01); *H05K 1/0326* (2013.01); *H05K 1/09* (2013.01);
(Continued)

(58) Field of Classification Search
CPC ............ H05K 1/03; H05K 1/09; H05K 1/034; H05K 3/1208
See application file for complete search history.

(56) References Cited

FOREIGN PATENT DOCUMENTS

| JP | 2003-238608 A | 8/2003 |
|----|---------------|--------|
| JP | 2003-240916 A | 8/2003 |

(Continued)

OTHER PUBLICATIONS

Sep. 13, 2016 International Search Report issued in International Patent Application No. PCT/JP2016/068543.

*Primary Examiner* — Elizabeth E Mulvaney
(74) *Attorney, Agent, or Firm* — Oliff PLC

(57) ABSTRACT

A wiring board manufacturing method and a wiring board in which a pattern can be simply and easily formed even when using a coating composition having a high surface tension are provided. The method includes a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and a conductor pattern forming step of applying a conductive coating composition onto a pattern transfer surface of the base material to form a conductor pattern, the base material having a pattern of a high surface free energy region and a low surface free energy region, and the high
(Continued)

surface free energy region having a surface free energy of more than 62 mJ/m².

15 Claims, 4 Drawing Sheets

(51) Int. Cl.
    *H05K 3/38*          (2006.01)
    *H05K 1/09*          (2006.01)
    *H05K 1/03*          (2006.01)

(52) U.S. Cl.
    CPC ..... *H05K 3/381* (2013.01); *H05K 2203/0195* (2013.01); *H05K 2203/1105* (2013.01); *H05K 2203/1173* (2013.01)

(56) References Cited

FOREIGN PATENT DOCUMENTS

| | | |
|---|---|---|
| JP | 2005-052686 A | 3/2005 |
| JP | 2005-71308 A | 3/2005 |
| JP | 2011-014829 A | 1/2011 |
| JP | 2013-512568 A | 4/2013 |
| JP | 2014-232277 A | 12/2014 |
| JP | 2014-240137 A | 12/2014 |
| WO | 2015/087634 A1 | 6/2015 |

WIRING BOARD MANUFACTURING METHOD AND WIRING BOARD

TECHNICAL FIELD

The present disclosure relates to a wiring board manufacturing method and a wiring board in which a surface free energy difference of a master is transferred to a base material onto which a conductor pattern is formed. This application claims priority based on Japanese Patent Application No. 2015-150835 filed on Jul. 30, 2015 and Japanese Patent Application No. 2016-123571 filed on Jun. 22, 2016, the entire contents of which are hereby incorporated by reference.

BACKGROUND ART

Currently, photolithography techniques are used to fabricate most of the fine patterns in electronic circuits of semiconductors, displays, and other electronic products; however, limits exist on manufacturing inexpensive products using photolithography techniques. Moreover, when attempting to manufacture electronic products having increased surface areas, maintaining low manufacturing costs while using fabrication methods employing photolithography techniques has been difficult.

In view of this current situation, application of printing techniques to manufacturing electronic circuits, sensors, and other devices, these being known as "printed electronics," is under investigation. Such methods are expected to reduce chemical substance usage and have attracted attention as environmentally friendly manufacturing processes. Moreover, such methods have been applied to printing electrodes of membrane keyboards, automotive window glass heating wires, and RFID (Radio Frequency Identification) tag antennas, among others.

In printed electronics, control of base material (printed side) wettability is of critical importance. Control of wettability is achieved by controlling surface free energy, for which various methods have been proposed. Among these, base materials having a surface free energy difference patterning have been proposed.

For example, PLT 1 describes a technique of separated application in which a surface is modified with radiation or generated ozone via a mask to form a pattern of a surface free energy difference to which an ink is coated. However, in the technique described in PLT 1, although a surface free energy difference is formed in the base material, because this surface free energy difference is low, in the case of applying ink to the surface, the technique cannot realize completely separated application but can only accomplish a film thickness difference in a coating film.

Furthermore, PLT 2 describes a technique of exposing a portion of a surface using a transparency difference of a Fresnel lens to form a low surface free energy portion before exposing the unexposed portion while submersed in water to form a high surface free energy portion. Moreover, a technique of coating ink to the formed pattern before peeling away excess ink to form a pattern is described. However, as in PLT 1, the technique described in PLT 2, although forming a surface free energy difference in the base material, cannot realize separated application through simply applying ink to the surface, and requires processes for peeling the ink from a portion (low surface free energy portion) in which ink deposition is not desired.

Furthermore, PLT 3 describes a technique of modifying a portion of a surface with radiation via a mask to form a surface free energy difference pattern before transferring with heat and pressure to form a pattern. However, the technique described in PLT 3, although forming a pattern by transferring a functional ink layer to a surface free energy pattern, requires heat and pressure at the time of application as well as processes for peeling away excess material.

Furthermore, PLT 4 describes a technique of selectively applying a coating composition to a coating film to which a pattern of a surface free energy difference of a master has been transferred. However, in the technique described in PLT 4, forming a pattern by selectively applying a coating composition having a high surface tension such as a water-based conductive coating composition has been difficult.

CITATION LIST

Patent Literature

PLT: 1 Japanese Unexamined Patent Application Publication No. 2005-52686
PLT: 2 Japanese Unexamined Patent Application Publication No. 2003-240916
PLT: 3 Japanese Unexamined Patent Application Publication No. 2011-14829
PLT: 4 Japanese Unexamined Patent Application Publication No. 2014-240137

SUMMARY OF THE INVENTION

Technical Problem

In view of such conventional circumstances, the present invention provides a wiring board manufacturing method and a wiring board in which a pattern can be simply and easily formed even when using a coating composition having a high surface tension.

Solution to Problem

In order to solve the aforementioned problems, a method for manufacturing a wiring board according to the present disclosure includes a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and a conductor pattern forming step of applying a conductive coating composition onto a pattern transfer surface of the base material to form a conductor pattern, the base material having a pattern of a high surface free energy region and a low surface free energy region, and the high surface free energy region having a surface free energy of more than 62 mJ/m$^2$.

Further, a wiring board according to the present disclosure includes a base material having a pattern of a high surface free energy region and a low surface free energy region; and a conductor pattern formed on the high surface free energy region, the high surface free energy region having a surface free energy of more than 62 mJ/m$^2$.

Still further, a method for manufacturing a pattern formation body according to the present disclosure includes a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and a pattern forming step of applying a coating composition onto a pattern transfer surface of the base material to form a pattern, the base material having a pattern of a high surface free energy region and a low surface free energy region, and the high surface free energy region having a surface free energy of more than 62 mJ/m$^2$.

Moreover, a pattern formation body according to the present disclosure includes a base material having a pattern of a high surface free energy region and a low surface free energy region; and a pattern formed on the high surface free energy region, the high surface free energy region having a surface free energy of more than 62 mJ/m$^2$.

Yet further, a base material according to the present disclosure, formed by curing a resin composition containing a first compound inducing a low surface free energy and a second compound inducing a surface free energy which is higher than that of the first compound includes a pattern of a high surface free energy region and a low surface free energy region, the high surface free energy region having a surface free energy of more than 62 mJ/m$^2$.

Furthermore, a resin composition according to the present disclosure includes a first compound inducing a low surface free energy; and a second compound inducing a surface free energy which is higher than that of the first compound, the second compound containing a monofunctional (meth)acrylate, and content of the monofunctional (meth)acrylate being 40 to 70 pts. mass with respect to 100 pts. mass of the second compound.

Advantageous Effects of Invention

According to the present disclosure, high surface free energy of the high surface free energy region of the base material enables use of a coating composition having a high surface tension and enables simple and easy formation of a pattern.

DESCRIPTION OF EMBODIMENTS

Figure 1:
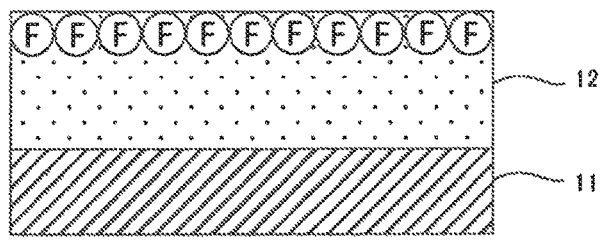
FIG. 1 is a cross-sectional view schematically illustrating a coating step of coating a resin composition onto a supporting film.

Embodiments of the present invention will now be described in detail according to the following order with reference to the accompanying drawings.
1. Wiring Board Manufacturing Method
2. Wiring Board
3. Other Embodiments
4. Examples
1. Wiring Board Manufacturing Method A method for manufacturing a wiring board according to one embodiment of the present disclosure includes a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and a conductor pattern forming step of applying a conductive coating composition onto a pattern transfer surface of the base material to form a conductor pattern. Herein, the base material has a pattern of a high surface free energy region and a low surface free energy region, and, because the high surface free energy region has a surface free energy of more than 62 mJ/m$^2$, a coating composition having a high surface tension can be used and, for example, it is possible to selectively coat a water-based conductive coating composition and form a conductor pattern.

Transferring Step

The transferring step includes, first, preparing a resin composition which contains a first compound inducing a low surface free energy and a second compound inducing a surface free energy which is higher than that of the first compound. Examples of the resin composition include acrylic resin and epoxy resin, among which a photocurable acrylic resin composition having a fast curing reaction can be favorably used. Below, a photocurable acrylic resin composition containing the first compound, the second compound, and a photoinitiator will be described as an example.

In the first compound, it is possible to use surface conditioning agents such as those known as "anti-blocking agents," "slipping agents," "leveling agents," and "antifouling agents," among others, which induce a low surface free energy; a fluororesin based compound such as a perfluoropolyether derivative or a silicone resin based compound is preferably used. Examples of fluororesin based compounds include perfluoropolyether group-containing (meth)acrylates and perfluoroalkyl group-containing (meth)acrylates, among others; examples of silicone resin based compounds include polydimethylsiloxane-containing (meth)acrylate and polyalkylsiloxane-containing (meth)acrylate. These may be used individually or in a combination of two or more. Among these, a perfluoropolyether group-containing (meth)acrylate is preferably used in view of solubility, among other considerations. Examples of commercially available products of a perfluoropolyether group-containing (meth)acrylate include trade name "KY-1203" (Shin-Etsu Chemical Co., Ltd.), among others. Herein, (meth)acrylate is meant to include acrylic acid esters (acrylate) and methacrylic acid esters (methacrylate).

Content of the first compound in the resin composition is preferably 0.01 to 30 pts. mass and more preferably 0.1 to 10 pts. mass with respect to 100 pts. mass of the second compound because insufficient content cannot achieve the surface free energy difference pattern and excessive content tends to reduce surface free energy differences.

The second compound may be any compound so long as it induces a higher surface free energy than the first compound and examples include monofunctional (meth)acrylate, bifunctional (meth)acrylate, and trifunctional or higher functional (meth)acrylate.

Examples of the monofunctional (meth)acrylate include polyalkylene glycol ester monomers and alkyl (meth)acrylate having a linear or branched alkyl group, among others. In particular, examples of polyalkylene glycol ester monomers include hydroxyethyl (meth)acrylate, hydroxypropyl (meth)acrylate, polyethylene glycol mono(meth)acrylate, polypropylene glycol mono(meth)acrylate, polybutylene glycol mono(meth)acrylate, and polyethylene glycol polypropylene glycol mono(meth)acrylate, among others; these may be used individually or in a combination of two or more. Among these, polyethylene glycol mono(meth)acrylate can be preferably used in view of reactivity, crosslinking properties, and surface hardness, among other considerations. Examples of commercial products of polyethylene glycol mono(meth)acrylate include trade name "AE-400" (NOF CORPORATION).

In particular, examples of bifunctional (meth)acrylate include tricyclodecane dimethanol di(meth)acrylate dimethylol tricyclodecane di(meth)acrylate EO-modified bisphenol A di(meth)acrylate, 1,9-nonanediol di(meth)acrylate, 1,10-decanediol di(meth)acrylate, 2-hydroxy-3-acryloyloxypropyl (meth)acrylate, propoxylated bisphenol A di(meth)acrylate, diethylene glycol di(meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexanediol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate, and EO-modified isocyanurate di(meth)acrylate, among others; these may be used individually or in a combination of two or more.

In particular, examples of trifunctional or higher functional (meth)acrylates include pentaerythritol tri(meth)acrylate, propylene glycol modified glycerol triacrylate, EO-modified pentaerythritol tri(meth)acrylate, EO-modified isocyanurate tri(meth)acrylate, ε-caprolactone modified tris-(2-acryloxyethyl) isocyanurate, trimethylolpropane tri (meth)acrylate, ε-caprolactone modified tris(acryloxyethyl) (meth)acrylate, ethoxylated (20) trimethylolpropane tri (meth)acrylate, propoxylated (3) trimethylolpropane tri (meth)acrylate, propoxylated (6) trimethylolpropane tri (meth)acrylate, ethoxylated (9) trimethylolpropane tri(meth) acrylate, propoxylated (3) glyceryl tri(meth)acrylate, ethoxylated (4) pentaerythritol tetra(meth)acrylate, pentaerythritol tetra(meth)acrylate, ditrimethylolpropane tetra (meth)acrylate, dipentaerythritol penta(meth)acrylate, EO-modified dipentaerythritol penta(meth)acrylate, and dipentaerythritol hexa(meth)acrylate; these may be used individually or in a combination of two or more. Among these, pentaerythritol tri(meth)acrylate and propylene glycol modified glycerol triacrylate can be favorably used in view of reactivity, crosslinking properties, and surface hardness, among other considerations. Examples of commercially available products of pentaerythritol tri(meth)acrylate include trade name "TMM-3" (Shin Nakamura Chemical Co., Ltd.), and examples of commercially available products of propylene glycol modified glycerol triacrylate include trade name "OTA-480" (DAICEL-ALLNEX LTD.), among others.

The second compound preferably includes a monofunctional (meth)acrylate; content of the monofunctional (meth) acrylate with respect to 100 pts. mass of the second compound is preferably 40 to 70 pts. mass. Insufficient content of the monofunctional (meth)acrylate impedes high surface free energy differences and excessive content tends to degrade reactivity and crosslinking properties.

The photoinitiator can be selected for use as appropriate from among known photoradical initiators. Examples of the photoinitiator include α-hydroxyalkylphenone, benzyldimethylketal, and α-aminoalkylphenone; these may be used individually or in a combination of two or more.

Examples of commercially available photoinitiators include, as an α-hydroxyalkylphenone, 1-hydroxy-cyclohexyl-phenyl-ketone (IRGACURE 184, BASF Japan Ltd.), 2-hydroxy-2-methyl-1-phenyl-propan-1-one (DAROCUR 1173, BASF Japan Ltd.) 1-[4-(2-hydroxyethoxy)-phenyl]-2-hydroxy-2-methyl-1-propan-1-one (IRGACURE 2959, BASF Japan Ltd.), and 2-hydroxy-1-{4-[4-(2-hydroxy-2-methyl-propionyl)-benzyl]-phenyl}-2-methyl-propan-1-one (IRGACURE 127, BASF Japan Ltd.). Moreover, examples of benzyldimethylketal include 2,2-dimethoxy-1,2-diphenylethan-1-one (IRGACURE 651, BASF Japan Ltd.), among others. Furthermore, examples of α-aminoalkylphenone include 2-methyl-1-(4-methylthiophenyl-2-morpholinopropan-1-one (IRGARCURE 907, BASF Japan Ltd.), and 2-benzyl-2-dimethylamino-1-(4-morpholinophenyl)-butanone-1 (IRGACURE 369, BASF Japan Ltd.). Among these, 1-hydroxy-cyclohexyl-phenyl-ketone (IRGACURE 184, BASF Japan Ltd.) is preferably used in view of realizing easy photocuring.

Content of the photoinitiator in the resin composition is preferably 0.1 to 10 pts. mass and more preferably 1 to 5 pts, mass with respect to 100 pts. mass of the second compound because insufficient content tends to reduce curing performance, which degrades adhesive properties and causes inadequate hardening, and excessive content tends to degrade properties such as adhesiveness due to defective polymerization.

Furthermore, so long as effects of the present invention are not impaired, the resin composition may contain additives such as solvents, leveling agents, hue adjusting agents, coloring agents, ultraviolet absorbers, antistatic agents, and various thermoplastic resin materials.

FIG. 1 is a cross-sectional view schematically illustrating a coating process of coating a resin composition onto a supporting film. For example, a bar coater, a spray coater, or a spin coater, among other devices, can be employed in coating.

The supporting film 11 is without particular limitation and PET (polyethylene terephthalate), glass, and polyimide, among other materials, may be used. Furthermore, either a transparent or opaque material may be used; however, using a material which is transparent to ultraviolet light allows irradiating ultraviolet light from the supporting film 11 side.

The resin composition 12, as described above, contains the first compound, the second compound, and the photoinitiator; the first compound exists on the surface. It should be noted that a fluororesin compound is illustrated in FIG. 1 as an example of the first compound; however, the present invention is not limited thereto.

Next, in the transferring step, the resin composition 12 is brought into contact with a master 20 and cured to form a base material to which a surface free energy difference pattern of the master 20 is transferred.

Figure 2:
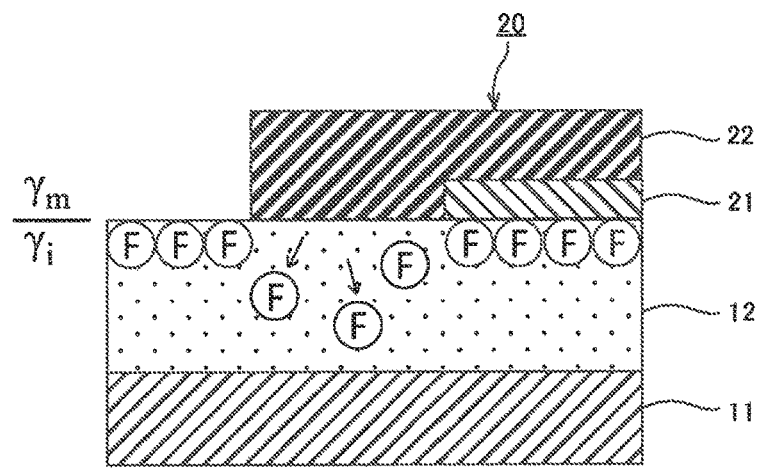
FIG. 2 is a cross-sectional view schematically illustrating a curing step in which a resin composition is brought into contact with a master and cured.

FIG. 2 is a cross-sectional view schematically illustrating a curing step in which the resin composition is brought into contact with the master and cured. In this curing step, the resin composition 12 is brought into contact with the master 20, having a pattern formed of surface free energy differences, and cured to form a cured resin layer, to which the pattern of the master 20 is transferred, on the supporting film 11.

The master 20 has a high surface free energy region 21 and a low surface free energy region 22 on a surface thereof. The high surface free energy region 21 is a region of, for example, silicon, metal such as aluminum or copper, glass, silicon oxide, or metal oxides such as aluminum oxide, among others; the low surface free energy region 22 is a region of low surface free energy coating film such as a fluorine coating or a silicone-based coating or inert gas such as nitrogen or carbon dioxide gas. The material of the master 20 is preferably a glass allowing easy coating with, for example fluorine. Furthermore, the master 20 preferably has a smooth surface.

As illustrated in FIG. 2, when the master 20 is brought into contact with the resin composition 12, at an interface between the master 20 and the resin composition 12, because $\Delta\gamma$ represented in the following Formula (1) tends to decrease, the first compound on the surface of the resin composition 12 moves to the low surface free energy region 21 of the master 20 and the second compound moves to the high surface free energy region 22. It should be noted that a fluororesin compound is illustrated in FIG. 2 as an example of the first compound; however, the present invention is not limited thereto.

$$\Delta\gamma = \gamma_m - \gamma_i \quad (1)$$

In the above Formula (1), $\gamma_m$ represents the surface free energy of the surface of the master 20 and $\gamma_i$ represents the surface free energy of the surface of the resin composition 12.

By curing the resin composition 12 in a state in which the master 20 is in contact with the resin composition 12, it is possible to form, on the supporting film 11, a base material 13 constituted by the cured resin layer to which the pattern of the master 20 is transferred. Methods for curing the resin composition 12 can be selected as appropriate according to the type of resin, and irradiation of energy such as heat or ultraviolet light, among others, can be used.

Figure 3:
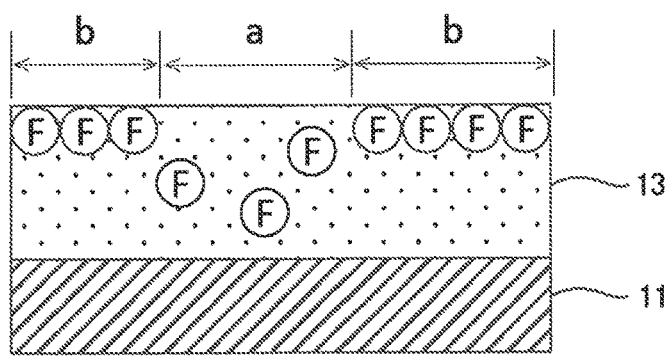
FIG. 3 is a cross-sectional view illustrating an example of a base material to which a pattern has been transferred.

FIG. 3 is a cross-sectional view illustrating an example of a base material to which the pattern has been transferred. It should be noted that a fluororesin compound is illustrated in FIG. 3 as an example of the first compound; however, the present invention is not limited thereto.

In the base material 13, the surface of the cured resin layer has a pattern of a high surface free energy region a and a low surface free energy region b. The base material 13 is formed by curing the resin composition containing the first compound which induces a low surface free energy and the second compound which induces a higher surface free energy than the first compound, and the base material 13 has the high surface free energy region a and the low surface free energy region b on the surface thereof. Furthermore, the high surface free energy region a and the low surface free energy region b have optically smooth surfaces and a height difference of preferably less than several tens of nanometers.

The high surface free energy region has a surface free energy of more than 62 mJ/m$^2$ and a difference of surface free energies between the high surface free energy region a and the low surface free energy region b is preferably 30 mJ/m$^2$ or more. In particular, the high surface free energy region a has a surface free energy of preferably 63 to 80 mJ/m$^2$ and more preferably 66 to 75 mJ/m$^2$. Furthermore, the low surface free energy region h has a surface free energy of preferably 10 to 25 mJ/m$^2$ and more preferably 10 to 20 mJ/m$^2$. Thereby, without using a complicated device and using a simple and convenient method, for example, a printing method such as dip coating, a conductive coating composition can be selectively applied to the high surface free energy region a. In particular, in the present embodiment, because the high surface free energy region of the base material has a high surface free energy, a coating composition having a high surface tension, such as those having a water base, can be used, thereby increasing the variety of usable coating compositions.

Conductor Pattern Forming Step

In the conductor pattern farming step, the conductive coating composition is coated to the pattern transfer surface of the base material to form a conductor pattern. The conductor pattern is selectively formed in the high surface free energy portion or the low surface free energy portion.

Examples of coating methods for the conductive coating composition include dip coating, spin coating, flow coating, spray coating, and squeegee methods, among others; among these, dip coating employing a simple and convenient device is preferably used.

The conductive coating composition is selectively applied to the high surface free energy region or the low surface free energy region on the surface of the base material and is formed into a conductor pattern by, for example, drying, heating, or baking, among other methods. Examples of usable conductive coating compositions include compositions known as conductive inks or metal inks in which metal particles having 1 to 100 nm particle diameters are dispersed at a high concentration in a solvent. Examples of the metal particles include those of conductive metals such as silver, gold, copper, nickel, and palladium; among these, silver having high conductivity is preferably used. Furthermore, it is preferable that the conductive coating composition contains an organic compound (ligand) and the dispersing force of the ligand is used to disperse the metal particles in the solution. As a solvent, in view of solubility of the ligand, it is preferable to use a polar solvent such as water, methanol, or ethanol, among others, and the conductive coating composition is preferably hydrophilic. Examples of commercially available products of the conductive coating composition include "TEC-PR-010" (InkTee Co., Ltd.), "TEC-IJ-010" (InkTec Co., Ltd.), and "DryCure Ag" (COLLOIDAL INK Co., Ltd.), among others.

In the case of using a coating composition having a high surface tension, the surface free energy of the high surface free energy region is preferably higher than a surface free energy of the coating composition minus 10 mJ/m$^2$ and more preferably equal to or higher than the surface free energy of the coating composition minus 6 mJ/m$^2$. That is, the surface free energy of the high surface free energy region is lower than the surface free energy of the coating composition by preferably less than 10 mJ/m$^2$ and more preferably by 6 mJ/m$^2$ or less. Achieving excellent adhesion between the base material and the coating composition (ink) requires that the ink sufficiently wets the surface of the base material; in this regard, wettability of the base material depends on the relative surface tensions of the ink and the base material and wettability increases as the surface tension of the base material increases relative to the surface tension of the ink. It should be noted that surface tension is the surface free energy per unit area, and when expressing the surface tension γ (mN/m) of a surface of a given liquid, this is equivalent to the liquid having a surface free energy γ ($mJ/m^2$).

In such a conductor pattern forming step, by using a base material having a high surface free energy region having a high surface free energy, and by coating a conductive coating composition having a water base and a high surface tension, separated application can be performed selectively, and a pattern having a fine pitch and excellent dimensional stability can be simply and conveniently drawn.

Furthermore, the conductor pattern forming step requires neither complicated processes such as exposure processes using photomasks and photoresists nor other processes such as peeling away excess conductive coating composition. It is thus possible to form the conductor pattern with the minimum required amount of the conductive coating composition.

2. Wiring Board

A wiring board according to one embodiment of the present invention includes a base material having a pattern of a high surface free energy region and a low surface free energy region, and a conductor pattern formed on the high surface free energy region, in which the high surface free energy region has a surface free energy of more than 62 $mJ/m^2$. Thereby, it is possible to form a conductor pattern by using a conductive coating composition having a water base exhibiting a high surface tension.

Figure 4:
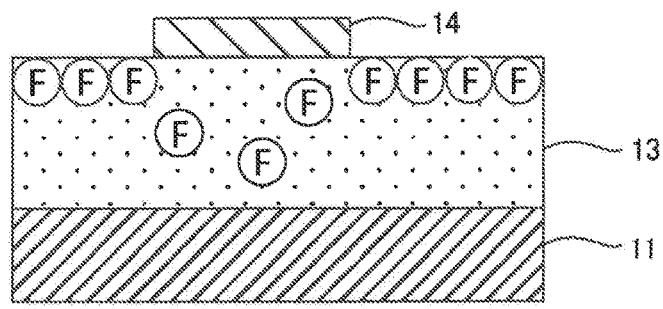
FIG. 4 is a cross-sectional view illustrating an example of a wiring board on which a conductor pattern is formed on a surface of a base material.

FIG. 4 is a cross-sectional view illustrating an example of a wiring board on which a conductor pattern is formed on a surface of a base material. As illustrated in FIG. 4, the wiring board has, on a supporting film 11, a base material 13 having a low surface free energy region and a high surface free energy region on a surface, and a conductor pattern 14 formed on the high surface free energy region. It should be noted that a fluororesin compound is illustrated in FIG. 4 as an example of the first compound; however, the present invention is not limited thereto. Moreover, because the supporting film 11 and the base material 13 are the same as the supporting film 11 and the base material 13 illustrated in FIGS. 1 to 3, further description will be omitted.

The conductor pattern is formed from the conductive coating composition being affixed to the high surface free energy region on the surface of the base material 13 by drying, heating, or baking, among other methods.

Further, the conductor pattern is formed on the high surface free energy region; the surface free energy of the low surface free energy region where the conductor pattern is not formed is preferably 10 to 25 $mJ/m^2$ and more preferably 10 to 20 $mJ/m^2$. Thereby, the conductive coating composition does not remain between wiring, which can prevent short circuits from occurring between the wiring. Thus, the wiring board according to the present embodiment is very useful in the field of electronics such as in electronic circuit patterns.

3. Other Embodiments

The above embodiments describe forming a conductor pattern; however, the present invention is not limited to forming a conductor pattern and is also applicable to forming a non-conductor pattern. Thus, a method for manufacturing a pattern formation body according to one embodiment of the present invention includes a transferring step of bringing a resin composition containing a first compound inducing a low surface free energy and a second compound inducing a surface free energy which is higher than that of the first compound into contact with a master on which a desired surface free energy difference pattern is formed and curing to form a base material to which the surface free energy difference pattern is transferred; and a pattern forming step of applying a coating composition onto a pattern transfer surface of the base material to form a pattern. Herein, the base material has a pattern of a high surface free energy region and a low surface free energy region, and the high surface free energy region has a surface free energy of more than 62 $mJ/m^2$ with which a coating composition having a high surface tension can be selectively coated and a pattern can be formed.

Further, a pattern formation body according to one embodiment of the present invention includes a base material having a pattern of a high surface free energy region and a low surface free energy region, and a pattern formed on the high surface free energy region, in which the high surface free energy region has a surface free energy of more than 62 $mJ/m^2$. Thereby, even in the case of using a coating composition having a high surface tension, it is possible to improve adhesion of the pattern on the high surface free energy region.

Still further, a base material according to one embodiment of the present invention is formed by curing a resin composition containing a first compound inducing a low surface free energy and a second compound inducing a surface free energy which is higher than that of the first compound and includes a pattern of a high surface free energy region and a low surface free energy region, in which the high surface free energy region has a surface free energy of more than 62 $mJ/m^2$. Thereby, even in the case of using a coating composition having a high surface tension, it is possible to form a pattern on the high surface free energy region.

Yet further, a resin composition according to one embodiment of the present invention includes a first compound inducing a low surface free energy and a second compound inducing a surface free energy which is higher than that of the first compound, in which the second compound contains a monofunctional (meth)acrylate and in which content of the monofunctional (meth)acrylate is 40 to 70 pts. mass with respect to 100 pts. mass of the second compound. Thereby, the surface free energy of the high surface free energy region of the base material after curing can be made higher than 62 $mJ/m^2$.

EXAMPLES

4. Examples

Hereinbelow, examples of the present invention will be described in detail. In the present examples, a master A on which pattern of a surface free energy difference was formed, a master B having a low surface free energy across the entire surface, and a master C having a high surface free energy across the entire surface were prepared, and each master was used to perform transfers to the resin composition. It should be noted that the present invention is not limited to these examples.

The following exposure device, contact angle meter, microscope, and AFM (atomic force microscope) were used.

exposure device A: Mask Aligner MA-20 (MIKASA CO., LTD.)

exposure device B: alignment exposure device (TOSHIBA LIGHTING & TECHNOLOGY CORPORATION)

contact angle meter: DM-701 (Kyowa Interface Science Co., Ltd.)
microscope: VHX-1000 (KEYENCE CORPORATION)
AFM: SPA400 (Hitachi High-Tech Science Corporation)
Master A Preparation A negative photoresist (trade name: OFPR-800LB, TOKYO OHKA KOGYO CO., LTD.) was applied by spin coating to 10×10 cm glass substrates which were then dried on a hot plate at 110° C. for 90 seconds. The photoresist coated substrates and a photomask having a 5 μm-line and space pattern were aligned and exposed using the exposure device A. After exposure, these substrates were developed by immersing in an aqueous solution of 2.38% tetramethylammonium hydroxide for one minute before immersing in pure water for one minute and drying at room temperature.

The developed substrates were first washed with pure water and then with a cleaning liquid (trade name: Novec 7300, 3M) before applying a fluorine coating agent (trade name: DS-5210F, HARVES Co., Ltd.) by drop casting. After leaving to stand overnight, the developed substrates were washed with the cleaning liquid (trade name: Novec 7300, 3M) before applying a fluorine coating agent (trade name: DS-5210F, HARVES Co., Ltd.) by drop casting. After leaving to stand overnight again, the developed substrates were washed with the cleaning liquid (trade name: Novec 7300, 3M) and dried at room temperature.

Figure 5:
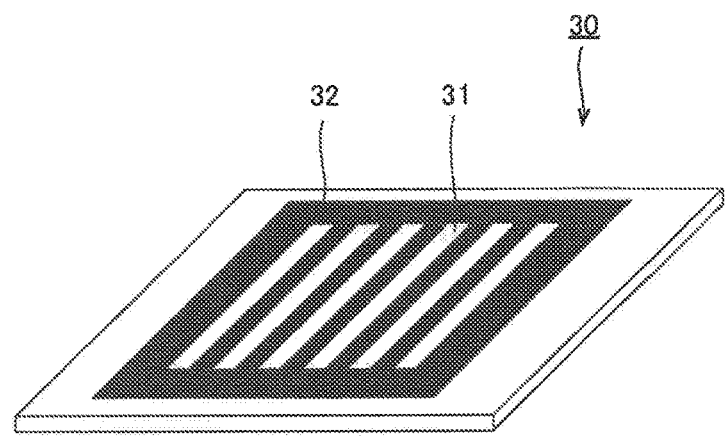
FIG. 5 is a perspective view schematically illustrating a master A.

The substrates were immersed in a stripping liquid for five minutes to remove resist film before washing first with acetone and then with the cleaning liquid (trade is name: Novec 7300, 3M). The master A having a patterning of a high surface free energy region 31 and a low surface free energy region 32 (fluorine coated in portions), as illustrated in FIG. 5, was thus prepared on a glass substrate 30.

Master B Preparation

Glass slides having 7×5 cm dimensions were washed with a cleaning liquid (trade name: Novec 7300, 3M) before applying a fluorine coating agent (trade name: DS-5210F, HARVES Co., Ltd.) by drop casting. After leaving to stand overnight, the glass slides were washed with the cleaning liquid (trade name: Novec 7300, 3M) before applying the fluorine coating agent (trade name: DS-5210F, HARVES Co., Ltd.) by drop casting. After leaving to stand overnight again, the glass slides were washed with the cleaning liquid (trade name: Novec 7300, 3M) to prepare the master B (fluorine coated on entire surface).

Master C Preparation

Unused 7×5 cm glass slides were used as the master C.

Ink Composition

Compositions of inks 1 to 6 are represented in Table 1.

TABLE 1

|  | Ink 1 | Ink 2 | Ink 3 | Ink 4 | Ink 5 | Ink 6 |
| --- | --- | --- | --- | --- | --- | --- |
| TMM-3 | 70 | 70 | 50 | 30 | 40 | 60 |
| OTA-480 | 25 | 0 | 0 | 0 | 0 | 0 |
| AE-400 | 5 | 30 | 50 | 70 | 60 | 40 |
| IRG. 184 | 3 | 3 | 3 | 3 | 3 | 3 |
| KY-1203 | 0.6 | 0.6 | 0.6 | 0.6 | 0.6 | 0.6 |

Figure 6:
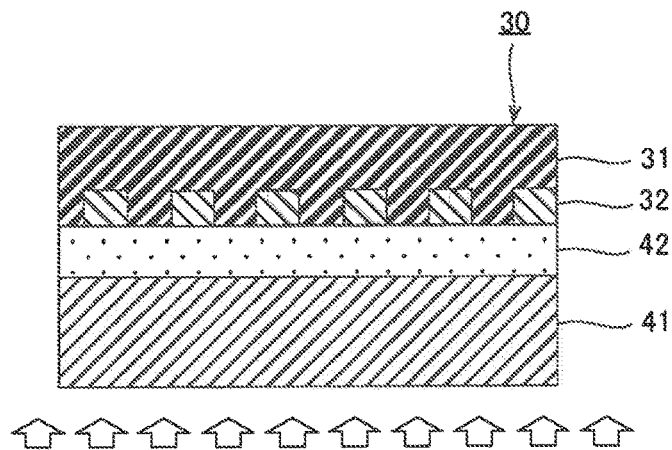
FIG. 6 is a cross-sectional view schematically illustrating transferring step of transferring a pattern of a master A.

TMM-3 (Shin Nakamura Chemical Co., Ltd.): pentaerythritol triacrylate
OTA-480 (DAICEL-ALLNEX LTD.): propylene glycol modified glycerol triacrylate
AE-400 (NOF CORPORATION): polyethylene glycol monoacrylate #400
IRGACURE 184 (BASF Japan Ltd.): 1-hydroxy-cyclohexyl-phenyl-ketone
KY-1203 (Shin-Etsu Chemical Co., Ltd.): perfluoropolyether-containing acrylate Base Material Preparation FIG. 6 is a cross-sectional schematic view illustrating a transferring step of transferring a pattern of the master A. As illustrated in FIG. 6, inks 1 to 6 were coated onto PET films using a bar coater (equivalent wet film thickness 8 μm), brought into close contact with the master A, and photocured by exposing with the exposure device B (alignment exposure device, TOSHIBA LIGHTING & TECHNOLOGY CORPORATION) from the PET surface side to prepare base materials having a cured resin layer. At this time, radiant exposure was 6 J/cm$^2$. The cured resin layers were peeled away from the master A, thus yielding base materials A1 to A6 having cured resin layers, on PET films, to which the surface free energy of the master A had been transferred. Likewise, with master B and master C, in the same manner, inks 1 to were cured to prepare base materials B1 to B6 and base materials C1 to C6 to which the surface free energies had been transferred.

Surface Free Energy Calculation

Surface free energies of the base materials B and C are represented in Table 2. Surface free energies were calculated using a contact angle meter to measure the contact angles for: the base materials B1 to B6 and C1 to C6 using the Kaelbe and Wu methods. Thus, the low surface free energy region of the base materials A1 to A6 were considered to have the surface free energy of the corresponding base material B1 to B6 and the high surface free energy region of the base materials A1 to A6 wore considered to have the surface free energy of the corresponding base material C1 to C6.

TABLE 2

|  | Ink 1 | Ink 2 | Ink 3 | Ink 4 | Ink 5 | Ink 6 |
| --- | --- | --- | --- | --- | --- | --- |
| Base material B surface free energy $\gamma_B$ [mJ/m$^2$] | 16 | 15 | 17 | 17 | 17 | 17 |
| Base material C surface free energy $\gamma_C$ [mJ/m$^2$] | 51 | 62 | 66 | 69 | 68 | 63 |

Separated Application Properties Evaluation

Sample containers were filled with a metal ink (DryCure Ag. COLLOIDAL INK Co,., Ltd., surface tension: 72 mN/m), The base materials A1 to C6 were dipped into the sample containers, vertically withdrawn at a speed of 1 cm/min, and left to dry at room temperature fear 10 minutes. The surface after coating was observed at 2000× magnification using an optical microscope. Cases in which the coating on the observed surface was according to the pattern were evaluated as good (hereinafter referred to as G); cases in which the coating on the observed surface was according to the pattern in portions were evaluated as intermediate (hereinafter referred to as I); cases in which the coating on the observed surface was not according to the pattern were evaluated as fail (hereinafter referred to as F).

Example 1

Ink 3 was coated onto a PET film using a bar coater (equivalent wet film thickness 8 μm), brought into close contact with the master A, and photocured by exposure using the exposure device B (alignment exposure device, TOSHIBA LIGHTING & TECHNOLOGY CORPORATION) from the PET surface side to form a cured resin layer. At this time, radiant exposure was 6 mJ/cm$^2$. The cured resin layer was peeled away from the master A, thus yielding a base material A3 having the cured resin layer, on a PET film, to which the surface free energy of the master A had been transferred. Moreover, using master B and master C, ink 3 was cured to obtain the base material B3 and the base material C3.

Figure 7:
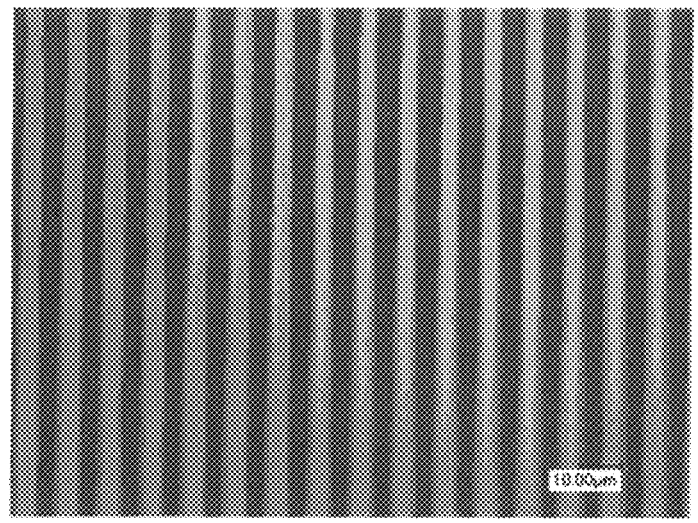
FIG. 7 is an image observed using an optical microscope of a conductor pattern formed on a base material A3 in Example 1.

As represented in Table 3, the base material B3 had a surface free energy of 17 mJ/m² and the base material C3 had a surface free energy of 66 mJ/m². Accordingly, the base material A3 was considered to have a surface free energy of 17 mJ/m² for the low surface free energy region and 66 mJ/m² for the high surface free energy region. Moreover, the difference between the surface free energy of the high surface free energy region and the surface tension of the metal ink was considered to be 6 mJ/m². FIG. 7 is an image observed using an optical microscope of a conductor pattern formed on the base material A3 of Example 1. The conductive coating composition was coated only to the high surface free energy portions and separated application properties were evaluated as G.

Example 2

Figure 8:
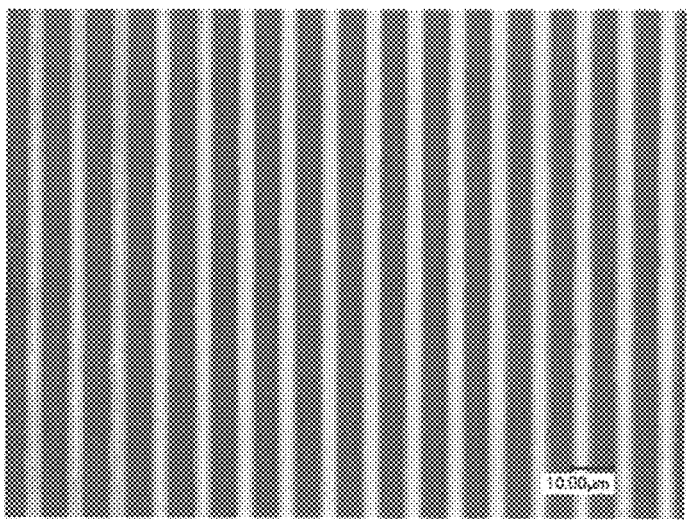
FIG. 8 is an image observed using an optical microscope of a conductor pattern formed on a base material A4 in Example 2.

With the exception that ink 4 was used, the base material A4, the base material B4, and the base material C4 were prepared in the same manner as Example 1. As represented in Table 3, the base material B4 had a surface free energy of 17 mJ/m² and the base material C4 had a surface free energy of 69 mJ/m². Accordingly, the base material A4 was considered to have a surface free energy of 17 mJ/m² for the low surface free energy region and 69 mJ/m² for the high surface free energy region. Moreover, the difference between the surface free energy of the high surface free energy region and the surface tension of the metal ink was considered to be 3 mJ/m². FIG. 8 is an image observed using an optical microscope of a conductor pattern formed on the base material A4 of Example 2. The conductive coating composition was coated only to the high surface free energy portions and separated application properties were evaluated as G.

Example 3

With the exception that ink 5 was used, a base material A5, a base material B5, and a base material C5 were prepared in the same manner as Example 1. As represented in Table 3, the base material B5 had a surface free energy of 17 mJ/m² and the base material C5 had a surface free energy of 68 mJ/m². Accordingly, the base material A5 was considered to have a surface free energy of 17 mJ/m² for the low surface free energy region and 68 mJ/m² for the high surface free energy region. Moreover, the difference between the surface free energy of the high surface free energy region and the surface tension of the metal ink was considered to be 4 mJ/m². As a result of observation with an optical microscope, the conductive coating composition was coated only to the high surface free energy portions and separated application properties were evaluated as G.

Example 4

With the exception that ink 6 was used, a base material A6, a base material B6, and a base material C6 were prepared in the same manner as Example 1. As represented in Table 3, the base material B6 had a surface free energy of 17 mJ/m² and the base material C5 had a surface free energy of 63 mJ/m². Accordingly, the base material A6 was considered to have a surface free energy of 17 mJ/m² for the low surface free energy region and 63 mJ/m² for the high surface free energy region. Moreover, the difference between the surface free energy of the high surface free energy region and the surface tension of the metal ink was considered to be 9 mJ/m². Observation with an optical microscope revealed that coating on the observed surface was not according to the pattern in portions, and separated application properties were evaluated as I.

Comparative Example 1

Figure 9:
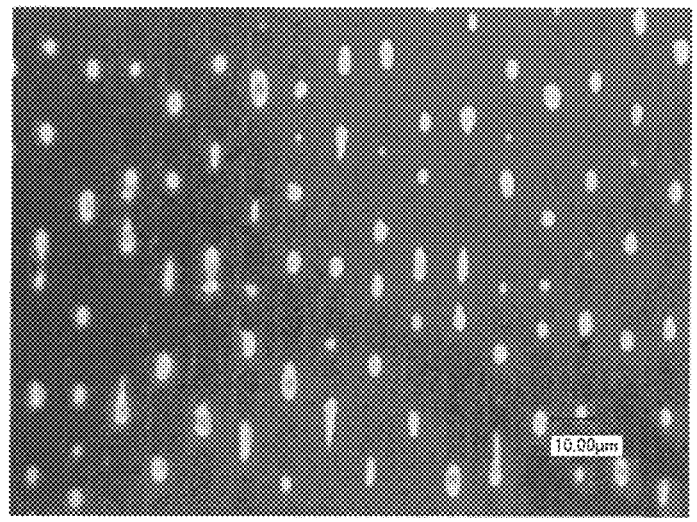
FIG. 9 is an image observed using an optical microscope of a conductor pattern formed on a base material A1 in Comparative Example 1.

With the exception that ink 1 was used, a base material A1, a base material B1, and a base material C1 were prepared in the same manner as Example 1. As represented in Table 3, the base material B1 had a surface free energy of 16 mJ/m² and the base material C1 had a surface free energy of 51 mJ/m². Accordingly, the base material A1 was considered to have a surface free energy of 16 mJ/m² for the low surface free energy region and 51 mJ/m² for the high surface free energy region. Moreover, the difference between the surface free energy of the high surface free energy region and the surface tension of the metal ink was considered to be 21 mJ/m². FIG. 9 is an image observed using an optical microscope of a conductor pattern formed on the base material A1 of Comparative Example 1. Coating on the observed surface was not according to the pattern, and separated application properties were evaluated as F.

Comparative Example 2

Figure 10:
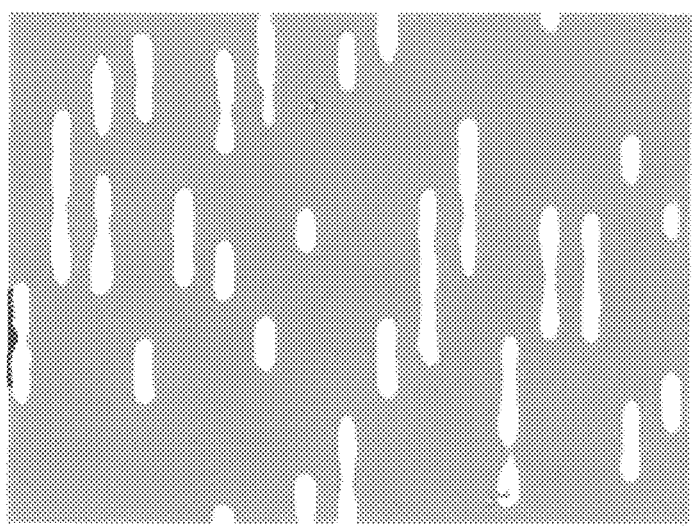
FIG. 10 is an image observed using an optical microscope of a conductor pattern formed on a base material A2 in Comparative Example 2.

With the exception that ink 2 was used, a base material A2, a base material B2, and a base material C2 were prepared in the same manner as Example 1. As represented in Table 3, the base material B2 had a surface free energy of 15 mJ/m² and the base material C2 had a surface free energy of 62 mJ/m². Accordingly, the base material A2 was considered to have a surface free energy of 15 mJ/m² for the low surface free energy region and 62 mJ/m² for the high surface free energy region. Moreover, the difference between the surface free energy of the high surface free energy region and the surface tension of the metal ink was considered to be 10 mJ/m². FIG. 10 is an image observed using an optical microscope of a conductor pattern formed on the base material A2 of Comparative Example 2. Coating on the observed surface was not according to the pattern, and separated application properties were evaluated as F.

TABLE 3

|  | Ex. 1 | Ex. 2 | Ex. 3 | Ex. 4 | Comp. 1 | Comp. 2 |
| --- | --- | --- | --- | --- | --- | --- |
| Resin composition | Ink 3 | Ink 4 | Ink 5 | Ink 6 | Ink 1 | Ink 2 |
| Base material B surface free energy $\gamma_B$ [mJ/m²] | 17 | 17 | 17 | 17 | 16 | 15 |
| Base material C surface free energy $\gamma_C$ [mJ/m²] | 66 | 69 | 68 | 63 | 51 | 62 |
| Conductive coating composition | DryCure Ag | DryCure Ag | DryCure Ag | DryCure Ag | DryCure Ag | DryCure Ag |
| Conductive coating composition surface tension $\gamma_L$ [mN/m] | 72 | 72 | 72 | 72 | 72 | 72 |

TABLE 3-continued

|  | Ex. 1 | Ex. 2 | Ex. 3 | Ex. 4 | Comp. 1 | Comp. 2 |
|---|---|---|---|---|---|---|
| $\gamma_C \cdot \gamma_L$ | −6 | −3 | −4 | −9 | −21 | −10 |
| Separated application properties | G | G | G | I | F | F |

As in Comparative Examples 1 and 2, in cases of the high surface free energy region of the base material having a surface free energy of 62 mJ/m² or less, separated application of metal ink having a high surface tension was problematic. In contrast, as in Examples 1 to 4, in cases of the high surface free energy region of the base material having a surface free energy of more than 62 mJ/m², separated application of metal ink having a high surface tension was possible.

Furthermore, Examples 1 to 4 revealed that by the surface free energy of the high surface free energy region being higher than the surface free energy of the coating composition minus 10 mJ/m², and, further, equal to or higher than the surface free energy of the coating composition minus 6 mJ/m², that is, by the surface free energy of the high surface free energy region being lower than the surface free energy of the coating composition by less than 10 mJ/m², and, further, by 6 mJ/m² or less, excellent separated application properties can be achieved. This is believed to be due to increased wetting of the metal ink with the base material surface.

Furthermore, Examples 1 to 4 revealed that by using inks 3 to 6 containing a monofunctional (meth)acrylate at 40 to 70 pts. mass with respect to 100 pts. mass total (meth)acrylate to manufacture a base material, even in the case of using a metal ink having a high surface tension, it is possible to selectively coat using a simple and convenient dip coating method.

REFERENCE SIGNS LIST

11 supporting film, 12 resin composition, 13 base material, 14 conductor pattern, 20 master, 21 low surface free energy region, 22 high surface free energy region, 30 glass substrate, 31 low surface free energy region, 32 high surface free energy region, 41 PET film, 42 resin composition

The invention claimed is:

1. A method for manufacturing a wiring board comprising:
   a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and
   a conductor pattern forming step of applying a conductive coating composition onto a pattern transfer surface of the base material to form a conductor pattern,
   wherein the base material has a pattern of a high surface free energy region and a low surface free energy region, and
   wherein the high surface free energy region has a surface free energy of more than 62 mJ/m².

2. The method for manufacturing a wiring board according to claim 1, wherein the surface free energy of the high surface free energy region is higher than a surface free energy of the conductive coating composition minus 10 mJ/m².

3. The method for manufacturing a wiring board according to claim 1, wherein the low surface free energy region has a surface free energy of 10 to 20 mJ/m².

4. The method for manufacturing a wiring board according to claim 1, wherein the conductive coating composition contains silver.

5. The method for manufacturing a wiring board according to claim 1, wherein the first compound is a perfluoropolyether derivative.

6. The method for manufacturing a wiring board according to claim 1, wherein the second compound contains a monofunctional (meth)acrylate, and
   wherein content of the monofunctional (meth)acrylate is 40 to 70 pts. mass with respect to 100 pts. mass of the second compound.

7. A wiring board comprising:
   a base material having a pattern of a high surface free energy region and a low surface free energy region; and
   a conductor pattern formed on the high surface free energy region,
   wherein the high surface free energy region has a surface free energy of more than 62 mJ/m².

8. The wiring board according to claim 7, wherein the conductor pattern is formed from a conductive coating composition, and
   wherein the surface free energy of the high surface free energy region is higher than a surface free energy of the conductive coating composition minus 10 mJ/m².

9. The wiring board according to claim 7, wherein the low surface free energy region has a surface free energy of 10 to 20 mJ/m².

10. The wiring board according to claim 8, wherein the conductive coating composition contains silver.

11. A method for manufacturing a pattern formation body comprising:
   a transferring step of bringing a resin composition containing a first compound inducing a low surface free energy and a second compound inducing a surface free energy which is higher than that of the first compound into contact with a master on which a desired surface free energy difference pattern is formed and curing the resin composition to form a base material to which the surface free energy difference pattern is transferred; and
   a pattern forming step of applying a coating composition onto a pattern transfer surface of the base material to form a pattern,
   wherein the base material has a pattern of a high surface free energy region and a low surface free energy region, and
   wherein the high surface free energy region has a surface free energy of more than 62 mJ/m².

12. A pattern formation body comprising:
   a base material having a pattern of a high surface free energy region and a low surface free energy region; and a pattern formed on the high surface free energy region, wherein the high surface free energy region has a surface free energy of more than 62 mJ/m$^2$.

13. A base material, formed by curing a resin composition containing a first compound inducing a low surface free energy and a second compound inducing a surface free energy which is higher than that of the first compound, comprising:
a pattern of a high surface free energy region and a low surface free energy region, wherein the high surface free energy region has a surface free energy of more than 62 mJ/m$^2$.

14. A resin composition comprising:
a first compound inducing a low surface free energy; and
a second compound inducing a surface free energy which is higher than that of the first compound,
wherein the second compound contains a monofunctional (meth)acrylate, and
wherein content of the monofunctional (meth)acrylate is 40 to 70 pts. mass with respect to 100 pts. mass of the second compound.

15. The resin composition according to claim 14, wherein the first compound is a perfluoropolyether derivative.

* * * * *